United States Patent
Yamamoto et al.

(10) Patent No.: US 7,398,070 B2
(45) Date of Patent: Jul. 8, 2008

(54) VARIABLE GAIN AMPLIFYING CIRCUIT WITH MATCHABLE INPUT/OUTPUT IMPEDANCE

(75) Inventors: Masaki Yamamoto, Fukushima-ken (JP); Masaaki Endo, Fukushima-ken (JP)

(73) Assignee: Alps Electronic Co., Ltd, Tokyo (JP)

( * ) Notice: Subject to any disclaimer, the term of this patent is extended or adjusted under 35 U.S.C. 154(b) by 465 days.

(21) Appl. No.: 11/271,244

(22) Filed: Nov. 8, 2005

(65) Prior Publication Data
US 2006/0099922 A1     May 11, 2006

(30) Foreign Application Priority Data
Nov. 11, 2004   (JP) ............................... 2004-006631

(51) Int. Cl.
H04B 7/00     (2006.01)
H04B 17/02    (2006.01)

(52) U.S. Cl. ..................... 455/232.1; 455/136; 455/138

(58) Field of Classification Search ................ 455/130, 455/302, 307, 311, 313, 285, 333, 334, 355, 455/245.1, 240.1, 251.1, 219, 232.1, 136, 455/138, 180.2, 188.2; 348/725, 731, 735; 334/47, 52

See application file for complete search history.

(56) References Cited

U.S. PATENT DOCUMENTS

| | | | | |
|---|---|---|---|---|
| 4,208,741 A | * | 6/1980 | Brun et al. | ............... 455/180.1 |
| 4,379,269 A | * | 4/1983 | Ijichi | ........................... 330/277 |
| 5,210,504 A | * | 5/1993 | Yagita et al. | ................. 330/253 |
| 6,037,999 A | * | 3/2000 | Kunishima | ................... 348/731 |
| 6,118,499 A | * | 9/2000 | Fang | ........................... 348/726 |
| 6,566,953 B2 | * | 5/2003 | Yamamoto | ................... 330/277 |
| 6,904,271 B2 | * | 6/2005 | Yamamoto | ............... 455/180.4 |
| 7,019,790 B2 | * | 3/2006 | Yamamoto | ................... 348/725 |
| 7,023,275 B2 | * | 4/2006 | Miyamoto | .................... 330/254 |
| 7,187,913 B1 | * | 3/2007 | Rahn et al. | ................ 455/188.1 |
| 7,248,107 B2 | * | 7/2007 | Brekelmans et al. | ......... 330/279 |
| 7,298,426 B2 | * | 11/2007 | Yamamoto | ................... 348/731 |
| 7,352,238 B2 | * | 4/2008 | Elwan et al. | ................... 330/86 |

FOREIGN PATENT DOCUMENTS

| JP | 11-220342 | 8/1999 |
|---|---|---|
| JP | 2001-036360 | 2/2001 |

* cited by examiner

*Primary Examiner*—Sonny Trinh
(74) *Attorney, Agent, or Firm*—Brinks Hofer Gilson & Lione

(57) ABSTRACT

A variable gain amplifying circuit includes a gate-grounded amplifying FET and a collector-grounded amplifying transistor. A gate voltage of the FET and a base voltage of the transistor are adjusted by a supplied AGC voltage. When an input RF signal has small amplitude, the gate voltage is increased by a high AGC voltage so as to increase a main current of the FET, thereby increasing a signal gain of the FET. When the input RF signal has large or medium amplitude, the gate voltage is decreased by a low AGC voltage so as to decrease a main current of the FET, thereby decreasing the signal gain of the FET.

8 Claims, 3 Drawing Sheets

VARIABLE GAIN AMPLIFYING CIRCUIT WITH MATCHABLE INPUT/OUTPUT IMPEDANCE

BACKGROUND OF THE INVENTION

1. Field of the Invention

The present invention relates to a variable gain amplifying circuit which is connected to a front stage of an antenna tuning circuit and has a collector-grounded transistor or a drain-grounded FET for impedance matching at an output stage such that an input RF signal amplified in the transistor or the FET at the output stage has no distortion when the intensity of an electric field of the RF signal is strong.

2. Description of the Related Art

Conventionally, an RF signal amplifying circuit, which is connected to a front stage of an antenna tuning circuit so as to amplify a received television signal in a television tuner, has been known. The RF signal amplifying circuit has an input stage to which an input adjusting unit is connected so as to correspond to the intensity of an electric-field of an input RF signal, the impedance of the input adjusting unit being adjusted corresponding to the intensity of an electric field of an input RF signal.

FIG. 3 is a circuit diagram showing an example of the configuration of the above-mentioned RF signal amplifying circuit in the related art, together with a subsequent circuit, which is disclosed in JP-A-11-220342.

Referring to FIG. 3, an RF signal amplifying circuit 50 includes an amplifying transistor 51, an input adjusting transistor 52, a collector load inductor 53, an emitter resistor 54, a bypass capacitor 55, a coupling capacitor 56, base bias resistors 57 and 58, a coupling capacitor 59, an emitter resistor 60, a bypass capacitor 61, a buffer resistor 62, a switch 63, a bias power supply 64, an antenna input stage 65, a signal output stage 66, and a power supply terminal 67, all of which are connected as shown in FIG. 3. In addition, a subsequent circuit connected to the signal output stage 66 of the RF signal amplifying circuit 50 includes a VHF tuning circuit (VHF TN) 74, a VHF AGC amplifying circuit (AGC AMP) 68, a UHF tuning circuit (UHF TN) 69, a UHF AGC amplifying circuit (AGC AMP) 70, buffer resistors 71 and 72, and an AGC voltage supply terminal 73, all of which are connected as shown in FIG. 3.

The operation of the above-mentioned RF signal amplifying circuit 50 is as follows.

When the intensity of the electric field of an input RF signal is weak or medium, a variable contact point 63(0) of the switch 63 is switched to one fixed terminal 63(1) and a ground voltage is supplied to a base of the input adjusting transistor 52. At this time, the input adjusting transistor 52 is cut off and drain-source impedance of the transistor 52 becomes considerably increased. Accordingly, the RF signal supplied to the antenna input stage 65 is not attenuated in the input adjusting transistor 52 to be supplied to a base of the amplifying transistor 51. In addition, the amplifying transistor 51 amplifies the RF signal supplied to the base of the transistor 51, and the amplified RF signal is output from a collector of the transistor 51 to be supplied to the subsequent circuit through the signal output stage 66.

Further, when the intensity of the electric field of the input RF signal is strong, a variable contact point 63(0) of the switch 63 is switched to the other fixed terminal 63(2) and an output bias voltage of the bias power supply 64 is supplied to a base of the input adjusting transistor 52. At this time, the input adjusting transistor 52 is turned on by supplying the bias voltage to the base and the drain-source impedance of the transistor 52 becomes smaller than before. Accordingly, the RF signal supplied to the antenna input stage 65 is slightly attenuated by the input adjusting transistor 52 to be supplied to a base of the amplifying transistor 51. In addition, the amplifying transistor 51 amplifies the RF signal supplied to the base of the transistor 51, and the amplified RF signal is output from a collector of the transistor 51 to be supplied to the subsequent circuit through the signal output stage 66.

Furthermore, in the subsequent circuit, when a VHF television signal is output from the signal output stage 66 of the RF signal amplifying circuit 50, the VHF television signal is selectively extracted from the VHF tuning circuit 74 to be supplied to the VHF AGC amplifying circuit 68. The VHF AGC amplifying circuit 68 amplifies the supplied VHF television signal with a signal gain set by an AGC voltage supplied to the AGC voltage supply terminal 73 and the amplified VHF television signal is supplied to a mixer or an intermediate frequency circuit at a subsequent stage. On the other hand, when a UHF television signal is output from the signal output stage 66 of the RF signal amplifying circuit 50, the UHF television signal is selectively extracted from the UHF tuning circuit 69 to be supplied to the UHF AGC amplifying circuit 70. The UHF AGC amplifying circuit 70 amplifies the supplied UHF television signal with the signal gain set by the AGC voltage supplied to the AGC voltage supply terminal 73 and the amplified VHF television signal is supplied to the mixer or the intermediate frequency circuit at the subsequent stage.

In this manner, in the RF signal amplifying circuit 50, when the intensity of the electric field of the input RF signal is weak or medium, the input RF signal is supplied to the amplifying transistor 51 to be amplified without being attenuated in the antenna input stage 65, but when the intensity of the electric field of the input RF signal is strong, the input RF signal is supplied to the amplifying transistor 51 to be amplified after being slightly attenuated in the antenna input stage 65. Accordingly, even when the intensity of the electric field of the input RF signal is strong, the amplifying transistor 51 is saturated, and thus the RF signal has no distortion.

However, in the above RF signal amplifying circuit 50 disclosed in JP-A-11-220342, when the intensity of the electric field of the input RF signal is weak or medium, the input RF signal is supplied to the amplifying transistor 51 without being attenuated, but when the intensity of the electric field of the input RF signal is strong, the input RF signal is supplied to the amplifying transistor 51 after being slightly attenuated. Therefore, it is difficult for the amplification of the RF signal to sufficiently follow the variation of the intensity of the electric field of the RF signal, and signal distortion may occur in some cases. In addition, since the switching operation on the intensity of the electric field is manually performed, a complicated control operation for switching between the electric field intensities is required to regularly monitor the variation of the intensity of the electric field of the RF signal.

SUMMARY OF THE INVENTION

The invention has been made in consideration of the above-described technical background, and it is an object of the invention to provide a variable gain amplifying circuit in which a signal gain is automatically controlled by an AGC voltage, an input RF signal has no distortion when the intensity of the electric field of the RF signal varies, and the input/output impedance can substantially match the impedance of an external circuit.

To achieve the above object, according to a first aspect of the invention, a variable gain amplifying circuit includes a semiconductor amplifying stage using a semiconductor amplifying device having a control electrode, a first main electrode, and a second main electrode having a low output impedance characteristic. In the semiconductor amplifying device, an RF signal is input to the control electrode and a bias circuit for generating a bias voltage is connected to the control electrode, the first main electrode is alternately grounded, and an amplified RF signal is output from the second main electrode. The bias circuit adjusts the bias voltage of the control electrode corresponding to a supplied AGC voltage. As the amplitude of the input RF signal becomes large, the bias voltage of the control electrode decreases and a main current flowing through the first main electrode and the second main electrode decreases to thereby decrease a signal gain of the semiconductor amplifying device, but as the amplitude of the input RF signal becomes small, the bias voltage of the control electrode increases and the main current increases to thereby increase the signal gain of the semiconductor amplifying device.

According to a second aspect of the invention, a variable gain amplifying circuit includes a semiconductor amplifying stage using first and second semiconductor amplifying devices, each having a control electrode, a first main electrode, and a second main electrode having a low output impedance characteristic. In the first semiconductor amplifying device, the control electrode is alternately grounded and a first bias circuit for generating a bias voltage is connected to the control electrode, an RF signal is input to the second main electrode, and an amplified RF signal is output from the first main electrode. In the second semiconductor amplifying device, the RF signal output from the first semiconductor amplifying device is input to the control electrode and a second bias circuit for generating a bias voltage is connected to the control electrode, the first main electrode is alternately grounded, and an amplified RF signal is output from the second main electrode. The first and second bias circuits adjust the bias voltages of the control electrodes, respectively, corresponding to a supplied AGC voltage. As the amplitude of the input RF signal becomes large, the bias voltage supplied to the control electrode of the first semiconductor amplifying device decreases and a main current flowing through the first main electrode and the second main electrode of the first semiconductor amplifying device decreases to thereby decrease a signal gain of the first semiconductor amplifying device, but as the amplitude of the input RF signal becomes small, the bias voltage of the control electrode of the first semiconductor amplifying device increases and the main current increases to thereby increase the signal gain of the semiconductor amplifying device. As the amplitude of the input RF signal becomes large, the bias voltage supplied to the control electrode of the second semiconductor amplifying device increases and a main current flowing through the first main electrode and the second main electrode of the second semiconductor amplifying device increases, but as the amplitude of the input RF signal becomes small, the bias voltage of the control electrode of the second semiconductor amplifying device decreases and the main current decreases.

According to the variable gain amplifying circuit of the first aspect, the bias voltage of the control electrode of the semiconductor amplifying device is adjusted corresponding to a supplied AGC voltage. In addition, as the amplitude of the input RF signal becomes large, the bias voltage of the control electrode decreases and a main current flowing through the first main electrode and the second main electrode decreases, and thus the signal gain of the semiconductor amplifying device decreases. On the other hand, as the amplitude of the input RF signal becomes small, the bias voltage of the control electrode increases and the main current increases, and thus the signal gain of the semiconductor amplifying device increases. With this configuration, the signal gain of the semiconductor amplifying device is automatically adjusted even the intensity of the electric field of the input RF signal varies. Accordingly, the RF signal has no distortion even when the intensity of the electric field becomes strong. Also, since the RF signal is output from the second main electrode having a low output impedance characteristic of the semiconductor amplifying device, there is an effect in that the output impedance of the variable gain amplifying circuit can approximately match the impedance of an external circuit.

Further, according to the variable gain amplifying circuit of the second aspect, the bias voltage of each of the control electrodes of the first and second semiconductor amplifying devices is adjusted corresponding to a supplied AGC voltage. In addition, as the amplitude of the input RF signal becomes large, the bias voltage of each of the control electrodes decreases and a main current flowing through the first and second main electrodes of the first and second semiconductor amplifying devices decreases, and thus the signal gains of the first and second semiconductor amplifying devices decrease, respectively. On the other hand, as the amplitude of the input RF signal becomes small, the bias voltage of each of the control electrodes increases and the main current increases, and thus the signal gains of the first and second semiconductor amplifying devices increase, respectively. With this configuration, the signal gains of the firs and second semiconductor amplifying devices are automatically adjusted even the intensity of the electric field of the input RF signal varies. Accordingly, the RF signal has no distortion even when the intensity of the electric field becomes strong. In addition, since the RF signal is supplied to the second main electrode having a low output impedance characteristic of the first semiconductor amplifying device and the RF signal is output from the second main electrode having a low output impedance characteristic of the second semiconductor amplifying device, there is an effect in that the input/output impedance of the variable gain amplifying circuit can match the impedance of an external circuit.

DESCRIPTION OF THE PREFERRED EMBODIMENT

Preferred embodiments of the invention will now be described with reference to the accompanying drawings.

Figure 1:
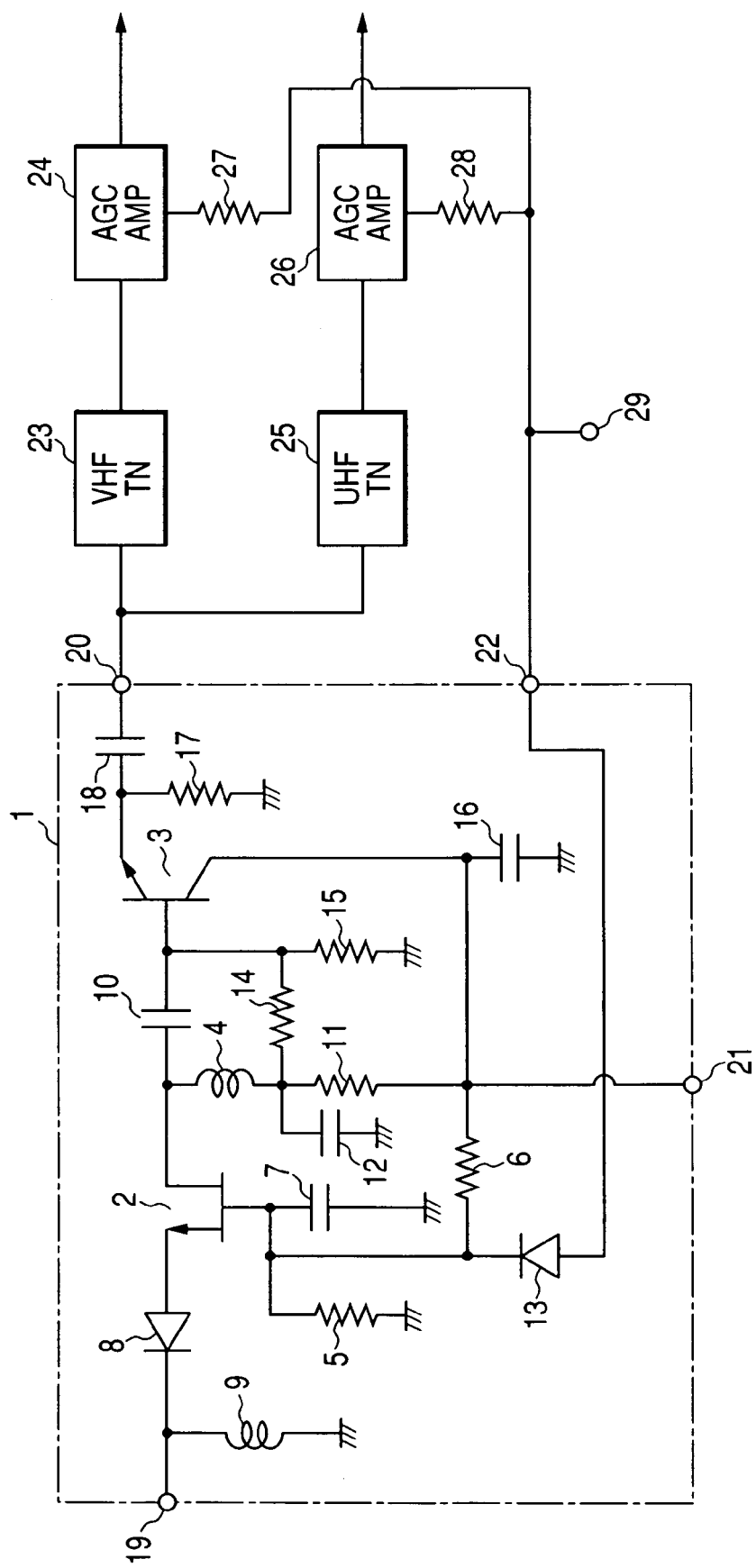
FIG. 1 is a circuit diagram illustrating the exemplary configuration of a variable gain amplifying circuit according to a first embodiment of the invention.

FIG. 1 is a circuit diagram illustrating an exemplary configuration of a variable gain amplifying circuit, together with a subsequent circuit, according to a first embodiment of the invention.

Referring to FIG. 1, an RF signal amplifying circuit 1 according to the first embodiment includes an FET (first semiconductor amplifying device) 2, a transistor (second semiconductor amplifying device) 3, a drain load inductor 4, gate resistors 5 and 6, a bypass capacitor 7, a PIN diode 8, a shunt inductor 9, a coupling capacitor 10, a drain resistor (first resistor) 11, a bypass capacitor 12, a diode 13, base voltage dividing resistors (second and third resistors) 14 and 15, a bypass capacitor 16, an emitter load resistor 17, a coupling capacitor 18, an antenna input stage 19, a signal output stage 20, a power supply terminal 21, and an AGC voltage supply stage 22. Further, a subsequent circuit connected to the signal output stage 20 of the variable gain amplifying circuit 1 includes a VHF tuning circuit (VHF TN) 23, a VHF AGC amplifying circuit (AGC AMP) 24, a UHF tuning circuit (UHF TN) 25, a UHF AGC amplifying circuit (AGC AMP) 26, buffer resistors 27 and 28, and an AGC voltage supply terminal 29.

Further, in the variable gain amplifying circuit 1, the FET 2 has a source connected to an anode of the PIN diode 8, a gate connected to one end of each of the gate resistors 5 and 6 and one end of the bypass capacitor 7 and a cathode of the diode 13, and a drain connected to one end of each of the drain load inductor 4 and one end of the coupling capacitor 10. The transistor 3 has a base connected to the other end of the coupling capacitor 10 and one end of each of the base voltage dividing resistors 14 and 15, a collector connected to the power supply terminal 21 and one end of the bypass capacitor 16, and an emitter connected to one end of each of the emitter load resistor 17 and one end of the coupling capacitor 18.

Furthermore, the other end of the drain load inductor 4 is connected to one end of the drain resistor 11, one end of the bypass capacitor 12, and the other end of the base voltage dividing resistor 14. The other end of each of the gate resistor 5 and the bypass capacitor 7 is grounded. The other end of the gate resistor 6 is connected to the power supply terminal 21. A cathode of the PIN diode 8 is connected to the antenna input stage 19 and one end of the shunt inductor 9. The other end of the shunt inductor 9, the other end of each of the bypass capacitors 12 and 16, the other end of the base voltage dividing resistor 15, and the other end of the emitter load resistor 17 are all grounded. An anode of the diode 13 is connected to the AGC voltage supply stage 22. The other end of the coupling capacitor 18 is connected to the signal output stage 20.

In addition, in the subsequent circuit connected to the signal output stage of the variable gain amplifying circuit 1, the VHF tuning circuit 23 has an input stage connected to the signal output stage 20 and an output stage connected to an input stage of the VHF AGC amplifying circuit 24. The VHF AGC amplifying circuit 24 has an output stage connected to a subsequent mixer or a subsequent intermediate frequency circuit or the like, and a control stage connected to the AGC voltage supply terminal 29 through the buffer resistor 27. The UHF tuning circuit 25 has an input stage connected to the signal output stage 20 and an output stage connected to an input stage of the UHF AGC amplifying circuit 26. The UHF AGC amplifying circuit 26 has an output stage connected to a subsequent mixer or a subsequent intermediate frequency circuit or the like, and a control stage connected to the AGC voltage supply terminal 29 through the buffer resistor 28. In this case, the VHF tuning circuit 23 and the UHF tuning circuit 25 include a plurality of inductors and one or two variable capacitance diodes and tunes the RF signal to a VHF signal or a UHF signal to be selected by supplying a tuning voltage to the variable capacitance diodes.

In this case, a sum of a first-divided voltage, which is obtained by dividing a power supply voltage supplied to the power supply terminal 21 by the gate resistor 6 and the gate resistor 5, and a voltage, which is supplied through the diode 13 from the AGC voltage supply stage 22 to which the AGC voltage is supplied, is applied to the gate of the FET 2 as a bias voltage. Further, a second divided voltage, which is obtained by dividing a power supply voltage dropped by the drain resistor 11 by the base voltage dividing resistors 14 and 15, is applied to the base of the transistor 3 as a bias voltage.

The operation of the above-described variable gain amplifying circuit 1 according to the first embodiment is as follows.

When a received television signal (hereinafter, referred to as an RF signal) is supplied to the antenna input stage 19, the RF signal is supplied to the source of the FET 2 through the PIN diode 8. The FET 2, which operates as a gate-grounded amplifying stage, amplifies the RF signal supplied to its source. The amplified RF signal is output from the drain of the FET 2 to be supplied to the base of the transistor 3 through the coupling capacitor 10. The transistor 3, which operates as a collector-grounded amplifying stage, amplifies the RF signal supplied to its base. The amplified RF signal is output from the drain of the transistor 3 to be supplied to the signal output stage 20 through the coupling capacitor 18.

In the amplifying operation of the RF signal, if the intensity of the electric field of the RF signal supplied to the antenna input stage 19 is weak and an amplified RF signal output from the signal output stage 20 has relatively small amplitude, a value of the AGC voltage supplied to the AGC voltage supply terminal 29 increases. At this time, the increased AGC voltage is superposed on the first divided voltage through the diode 13 and a total voltage having a high value is supplied to the gate of the FET 2. Accordingly, a main current flowing through the drain and source of the FET 2 increases, and thus the signal gain of the FET 2 increases. Thereby, the RF signal having small amplitude is amplified with a relatively high gain to be supplied to the subsequent transistor 3. In addition, when the main current of the FET 2 increases, a current flowing through the PIN diode 8 increases and the impedance of the PIN diode 8 is reduced, and thus the signal loss due to the PIN diode 8 is reduced. Accordingly, the RF signal supplied to the signal input stage 19 is applied to the source of the FET 2 with little attenuation.

Further, when the main current of the FET 2 increases, a voltage drop due to the drain resistor 11 becomes large and the drain voltage of the FET 2 is reduced. Since the reduced drain voltage is divided by the base dividing resistors 14 and 15 to be applied to the base of the transistor 3, a main current flowing through the collector and emitter of the transistor 3 decreases, and thus the signal gain of the transistor 3 slightly decreases. Accordingly, the RF signal amplified in the FET 2 is amplified with a relatively low gain to be supplied to the subsequent circuit through the signal output stage 20.

On the other hand, if the intensity of the electric field of the RF signal supplied to the antenna input stage 19 is strong or medium and an amplified RF signal output from the signal output stage 20 has relatively large amplitude, a value of the AGC voltage supplied to the AGC voltage supply terminal 29 decreases. At this time, the decreased AGC voltage is mostly blocked by the diode 13 not to be superposed on the first divided voltage, and accordingly, the first divided voltage having a low value is supplied to the gate of the FET 2 as a total voltage. Accordingly, a main current flowing through the drain and source of the FET 2 decreases, and thus the signal gain of the FET 2 decreases. Accordingly, the RF signal having large amplitude is amplified with a relatively low gain to be supplied to the subsequent transistor 3. In addition, when the main current of the FET 2 decreases, the current flowing through the PIN diode 8 also decreases and the impedance of the PIN diode 8 increases, so that the signal loss due to the PIN diode 8 increases. Accordingly, the RF signal supplied to the signal input stage 19 is applied to the source of the FET 2 with slight attenuation.

Furthermore, when the main current of the FET 2 decreases, a voltage drop due to the drain resistor 11 becomes small to increase the drain voltage of the FET 2. Since the increased drain voltage is divided by the base dividing resistors 14 and 15 to be applied to the base of the transistor 3, a main current flowing through the collector and emitter of the transistor 3 increases and the signal gain of the transistor 3 slightly increases. Accordingly, the RF signal amplified in the FET 2 is amplified with a relatively high gain to be supplied to the subsequent circuit through the signal output stage 20.

In this manner, according to the variable gain amplifying circuit 1 of the first embodiment, when the RF signal has relatively small amplitude, the signal loss due to the PIN diode 8 decreases and the signal gain due to the FET 2 increases although the signal gain due to the transistor 3 slightly decreases. Accordingly, it is possible to amplify the RF signal with a high total signal gain and with low noise. On the other hand, when the RF signal has relatively large or medium amplitude, the signal loss due to the PIN diode 8 increases and the signal gain due to the FET 2 decreases although the signal gain due to the transistor 3 slightly increases. Accordingly, it is possible to amplify the RF signal with a low total signal gain and with low noise. In addition, an input impedance of the variable gain amplifying circuit 1 has a low impedance characteristic since it has a source input configuration of the FET 2. Likewise, an output impedance of the variable gain amplifying circuit 1 has a low impedance characteristic since it has an emitter output configuration of the FET 2. Accordingly, the impedance matching between a previous-stage circuit and a subsequent-stage circuit can be achieved.

Next, the operation of the subsequent circuit of the variable gain amplifying circuit 1 will be described.

When the amplified RF signal is output from the signal output stage of the variable gain amplifying circuit 1, it is supplied to the VHF tuning circuit 23 and the UHF tuning circuit 25. If the RF signal is a VHF signal, the VHF signal is selectively extracted from the VHF tuning circuit 23 to be supplied to the VHF AGC amplifying circuit 24. Since the AGC voltage supplied to the AGC voltage supply terminal 29 is applied to the control stage of the VHF AGC amplifying circuit 24, the supplied VHF signal is subjected to an automatic gain control in correspondence with the amplitude thereof to be amplified. The amplified VHF signal is supplied to another subsequent circuit such as a mixer (not shown). On the other hand, if the RF signal is a UHF signal, the UHF signal is selectively extracted from the UHF tuning circuit 25 to be supplied to the UHF AGC amplifying circuit 26. Since the AGC voltage supplied to the AGC voltage supply terminal 29 is also applied to the control stage of the UHF AGC amplifying circuit 26, the supplied UHF signal is subjected to an automatic gain control in correspondence with the amplitude thereof to be amplified. The amplified UHF signal is supplied to another subsequent circuit such as a mixer (not shown).

Figure 2:
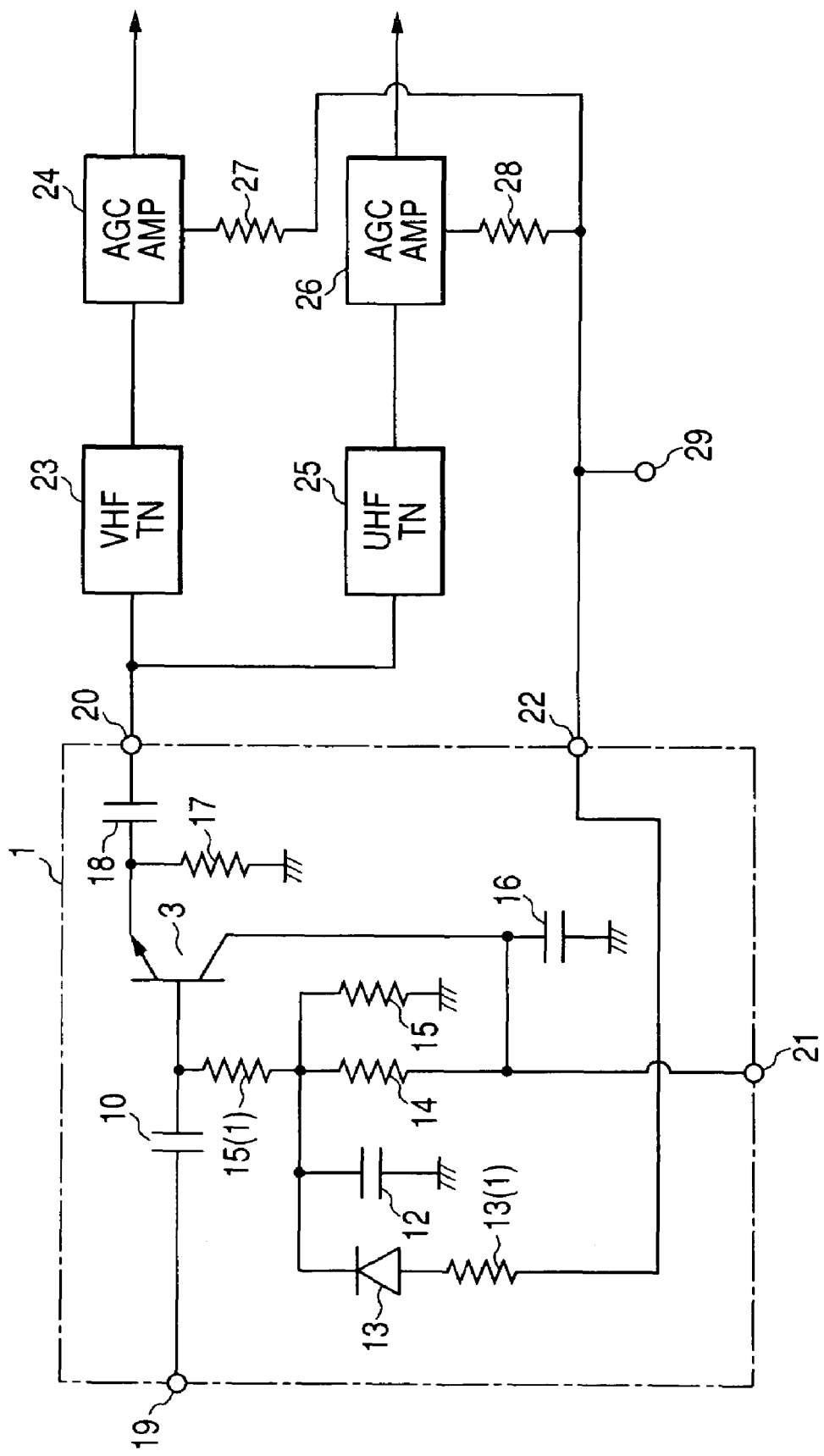
FIG. 2 is a circuit diagram illustrating the exemplary configuration of a variable gain amplifying circuit according to a second embodiment of the invention.
Figure 3:
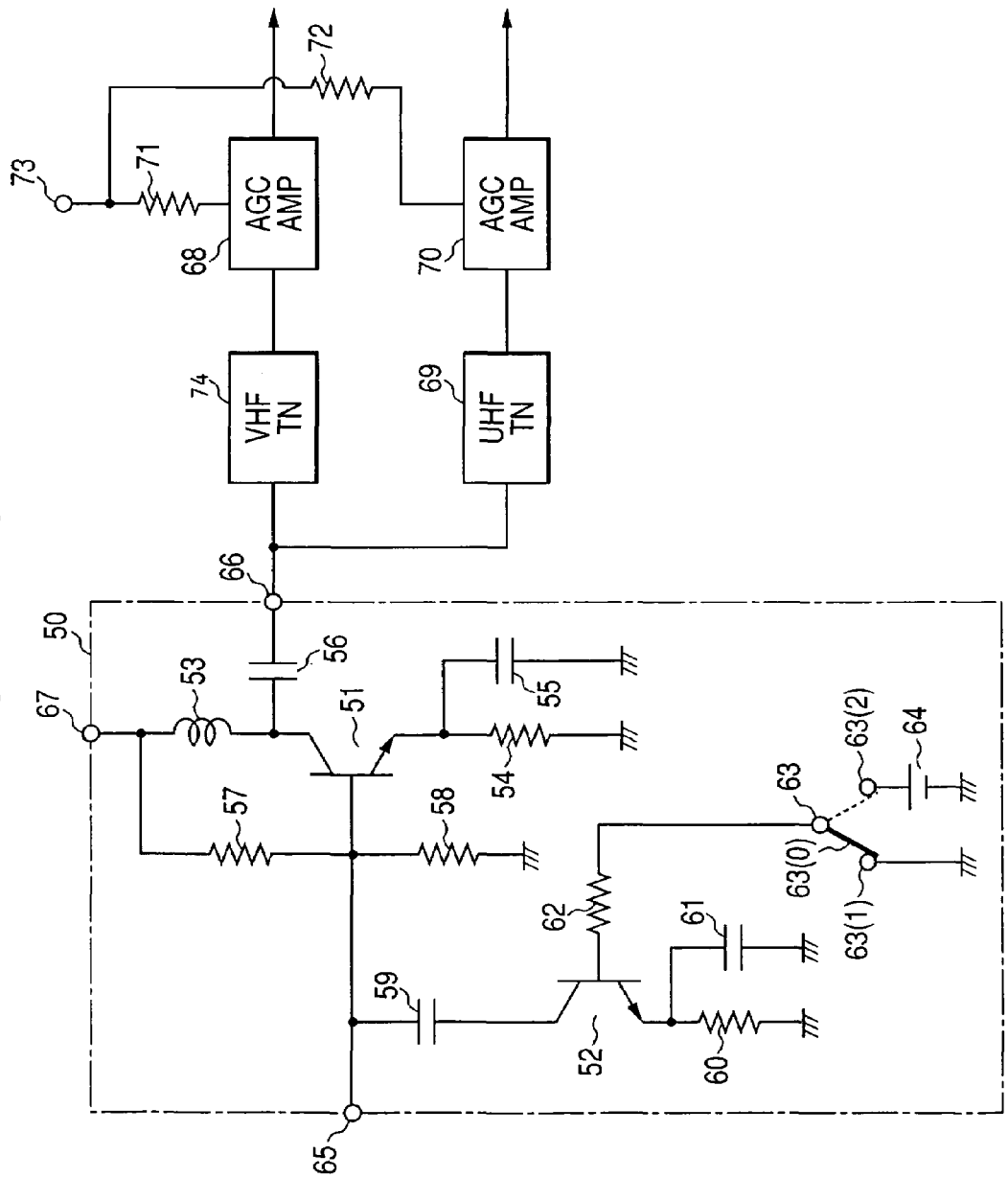
FIG. 3 is a circuit diagram illustrating the exemplary configuration of a conventional RF signal amplifying circuit.

FIG. 2 is a circuit diagram illustrating an exemplary configuration of a variable gain amplifying circuit, together with a subsequent circuit, according to a second embodiment of the invention.

Referring to FIG. 2, a variable gain amplifying circuit 1 according to the second embodiment is different from the variable gain amplifying circuit 1 according to the first embodiment in that the FET 2, the PIN diode 8, and related circuit components are omitted. Specifically, the variable gain amplifying circuit 1 according to the second embodiment includes a transistor (semiconductor amplifying device) 3, a coupling capacitor 10, a bypass capacitor 12, a diode 13, a buffer resistor 13(1), base voltage dividing resistors 14 and 15, a buffer resistor 15(1), a bypass capacitor 16, an emitter load resistor 17, a coupling capacitor 18, an antenna input stage 19, a signal output stage 20, a power supply terminal 21, and an AGC voltage supply stage 22. In addition, a subsequent circuit connected to the signal output stage 20 of the variable gain amplifying circuit 1 has the same configuration as that connected to the variable gain amplifying circuit 1 according to the first embodiment.

Further, in the variable gain amplifying circuit 1, the transistor 3 has a base connected to one end of the coupling capacitor 10 and one end of the buffer resistor 15(1), a collector connected to one end of the power supply terminal 21 and one end of the bypass capacitor 16, and an emitter connected to one end of the emitter load resistor 17 and one end of the coupling capacitor 18. The other end of the coupling capacitor 10 is connected to the signal input stage 19 and the other end of the coupling capacitor 18 is connected to the signal output stage 20. The diode 13 has an anode connected to one end of the buffer resistor 13(1) and a cathode connected to one end of the bypass capacitor 12, one end of each of the base voltage dividing resistors 14 and 15, and the other end of the buffer resistor 15(1). The other end of the bypass capacitor 12, the other end of the base voltage dividing resistor 15, and the other end of the bypass capacitor 16, and the other end of the emitter load resistor 17 are all grounded. The other end of the buffer resistor 13(1) is connected to the AGC voltage supply stage 22. The other end of the base voltage dividing resistor 14 is connected to the power supply terminal 21.

The operation of the above-configured variable gain amplifying circuit 1 according to the second embodiment is as follows.

When an RF signal is supplied to the antenna input stage 19, the RF signal is supplied to the base of the transistor 3 through the coupling capacitor 10. In this case, the transistor 3, which operates as a collector-grounded amplifying stage, amplifies the RF signal supplied to its base. The amplified RF signal is output from the drain of the transistor 3 to be supplied to the signal output stage 20 through the coupling capacitor 18. Here, the subsequent circuit of the variable gain amplifying circuit 1 has the same configuration and operation as that shown in FIG. 1, and therefore, operation thereof will be omitted.

If the intensity of the electric field of the RF signal supplied to the antenna input stage 19 is weak and an amplified RF signal output from the signal output stage 20 has relatively small amplitude, a value of the AGC voltage supplied to the AGC voltage supply terminal 29 increases. At this time, the increased AGC voltage is superposed on a divided voltage set by the base voltage dividing resistors 14 and 15 through the diode 13 and a total voltage having a high value is supplied to the base of the transistor 3. Accordingly, a main current flowing through the collector and emitter of the transistor 3 increases, and thus the signal gain of the transistor 3 increases. Accordingly, the RF signal having small amplitude is amplified with a relatively high gain to be supplied to the signal output stage 20 through the coupling capacitor 18.

On the other hand, if the intensity of the electric field of the RF signal supplied to the antenna input stage 19 is strong or medium and an amplified RF signal output from the signal output stage 20 has relatively large amplitude, a value of the AGC voltage supplied to the AGC voltage supply terminal 29 decreases. At this time, the decreased AGC voltage is mostly blocked by the diode 13 not to be superposed on the divided voltage, and the divided voltage having a low value is supplied to the base of the transistor 3 as a total voltage. Accordingly, a main current flowing through the collector and emitter of the transistor 3 decreases, and thus the signal gain of the transistor 3 decreases. Thereby, the RF signal having large amplitude is amplified with a relatively low gain to be supplied to the signal output stage 20 through the coupling capacitor 18.

In this manner, according to the variable gain amplifying circuit 1 of the second embodiment, when the RF signal has relatively small amplitude, the signal gain due to the transistor 3 increases. Accordingly, it is possible to amplify the RF signal with a high signal gain and with low noise. On the other hand, when the RF signal has relatively large or medium amplitude, the signal gain due to the transistor 3 decreases. Accordingly, it is possible to amplify the RF signal with a low signal gain and with low noise. In addition, an output impedance of the variable gain amplifying circuit 1 according to the second embodiment has a low impedance characteristic since it has an emitter output configuration of the transistor 3. Accordingly, the impedance matching between a previous-stage circuit and a subsequent-stage circuit can be achieved.

While the configuration in which the collector-grounded bipolar transistor 3 is used as the second semiconductor amplifying device has been exemplified in the variable gain amplifying circuit 1 of the first embodiment and the configuration in which the collector-grounded bipolar transistor 3 is used as the semiconductor amplifying device in the variable gain amplifying circuit 1 of the second embodiment, the second semiconductor amplifying device or the semiconductor amplifying device is not limited to the collector-grounded bipolar transistor 3, but a drain-grounded FET may be used.

The invention claimed is:

1. A variable gain amplifying circuit comprising:
   a semiconductor amplifying stage using a semiconductor amplifying device having a control electrode, a first main electrode, and a second main electrode having a low output impedance characteristic,
   wherein, in the semiconductor amplifying device, an RF signal is input to the control electrode and a bias circuit for generating a bias voltage is connected to the control electrode, the first main electrode is alternately grounded, and an amplified RF signal is output from the second main electrode, and
   wherein the bias circuit adjusts the bias voltage of the control electrode corresponding to a supplied AGC voltage, and as the amplitude of the input RF signal becomes large, the bias voltage of the control electrode decreases and a main current flowing through the first main electrode and the second main electrode decreases to thereby decrease a signal gain of the semiconductor amplifying device, but as the amplitude of the input RF signal becomes small, the bias voltage of the control electrode increases and the main current increases to thereby increase the signal gain of the semiconductor amplifying device.

2. The variable gain amplifying circuit according to claim 1,
   wherein the semiconductor amplifying device is a bipolar transistor.

3. The variable gain amplifying circuit according to claim 1,
   wherein the semiconductor amplifying device is an FET.

4. A variable gain amplifying circuit comprising:
   a semiconductor amplifying stage using first and second semiconductor amplifying devices, each having a control electrode, a first main electrode, and a second main electrode having a low output impedance characteristic,
   wherein, in the first semiconductor amplifying device, the control electrode is alternately grounded and a first bias circuit for generating a bias voltage is connected to the control electrode, an RF signal is input to the second main electrode, and an amplified RF signal is output from the first main electrode, and in the second semiconductor amplifying device, the RF signal output from the first semiconductor amplifying device is input to the control electrode and a second bias circuit for generating a bias voltage is connected to the control electrode, the first main electrode is alternately grounded, and an amplified RF signal is output from the second main electrode,
   wherein the first and second bias circuits adjust the bias voltages of the control electrodes, respectively, corresponding to a supplied AGC voltage, and as the amplitude of the input RF signal becomes large, the bias voltage supplied to the control electrode of the first semiconductor amplifying device decreases and a main current flowing through the first main electrode and the second main electrode of the first semiconductor amplifying device decreases to thereby decrease a signal gain of the first semiconductor amplifying device, but as the amplitude of the input RF signal becomes small, the bias voltage of the control electrode of the first semiconductor amplifying device increases and the main current increases to thereby increase the signal gain of the semiconductor amplifying device, and
   wherein, as the amplitude of the input RF signal becomes large, the bias voltage supplied to the control electrode of the second semiconductor amplifying device increases and a main current flowing through the first main electrode and the second main electrode of the second semiconductor amplifying device increases, but as the amplitude of the input RF signal becomes small, the bias voltage of the control electrode of the second semiconductor amplifying device decreases and the main current decreases.

5. The variable gain amplifying circuit according to claim 4,
   wherein the second bias circuit has a first resistor connected between the first main electrode of the first semiconductor amplifying device and a power supply, and second and third resistors for generating a divided voltage obtained by dividing a voltage at a first main electrode side of the first resistor, and the divided voltage is supplied to the control electrode of the second semiconductor amplifying device.

6. The variable gain amplifying circuit according to claim 4,
   wherein a PIN diode for passing the main current flowing through the first and second main electrodes of the first semiconductor amplifying device is connected in series to the second main electrode of the first semiconductor amplifying device, and
   the impedance of the PIN diode decreases or increases in correspondence with an increase or decrease of the main current.

7. The variable gain amplifying circuit according to claim 4,
   wherein the first semiconductor amplifying device is an FET and the second semiconductor amplifying device is a bipolar transistor.

8. The variable gain amplifying circuit according to claim 4,
   wherein the first semiconductor amplifying device and the second semiconductor amplifying device are FETs, respectively.

* * * * *